US010516404B2

(12) United States Patent
Lee

(10) Patent No.: US 10,516,404 B2
(45) Date of Patent: Dec. 24, 2019

(54) VOLTAGE CONTROLLED OSCILLATOR USING VARIABLE CAPACITOR AND PHASE LOCKED LOOP USING THE SAME

(71) Applicant: Samsung Electronics Co., Ltd., Suwon-si, Gyeonggi-do (KR)

(72) Inventor: Jong-Woo Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/923,620

(22) Filed: Mar. 16, 2018

(65) Prior Publication Data

US 2018/0205384 A1 Jul. 19, 2018

Related U.S. Application Data

(63) Continuation of application No. 13/751,449, filed on Jan. 28, 2013, now abandoned.

(30) Foreign Application Priority Data

Jan. 30, 2012 (KR) .................. 10-2012-0008866

(51) Int. Cl.
| | | |
|---|---|---|
| H03B 5/12 | (2006.01) |
| H03C 3/09 | (2006.01) |
| H03L 7/099 | (2006.01) |
| H01G 15/00 | (2013.01) |

(52) U.S. Cl.
CPC ............ *H03L 7/099* (2013.01); *H01G 15/00* (2013.01); *H03B 5/1215* (2013.01); *H03B 5/1228* (2013.01); *H03B 5/1265* (2013.01)

(58) Field of Classification Search
CPC ..... H03L 7/099; H03B 5/1265; H03B 5/1215; H03B 5/1228; H01G 15/00

USPC .......... 331/16, 25, 34, 36 C, 117 R, 117 FE, 331/167, 177 V, 179; 375/376; 327/150, 327/159

See application file for complete search history.

(56) References Cited

U.S. PATENT DOCUMENTS

| | | |
|---|---|---|
| 7,336,134 B1 | 2/2008 | Janesch et al. |
| 7,612,626 B2 | 11/2009 | Tang |
| 7,800,458 B2 | 9/2010 | Shin et al. |
| 2003/0067360 A1 | 4/2003 | Takada |
| 2004/0147237 A1 | 7/2004 | Eckl et al. |

(Continued)

FOREIGN PATENT DOCUMENTS

| | | |
|---|---|---|
| CN | 101207364 A | 6/2008 |
| JP | 2005-303582 A | 10/2005 |

(Continued)

OTHER PUBLICATIONS

European Office Action dated Nov. 13, 2019, issued in European Patent Application No. 13743001.3.

*Primary Examiner* — Richard Tan
(74) *Attorney, Agent, or Firm* — Jefferson IP Law, LLP

(57) ABSTRACT

A variable capacitor is provided. The variable capacitor includes a plurality of capacitor segments. The plurality of capacitor segments are connected in parallel within the variable capacitor. When a plurality of candidate capacitances allowable to the variable capacitor according to a connection state of the plurality of capacitor segments connected in parallel are sorted in a magnitude sequence, the plurality of candidate capacitances form a geometric series. The variable capacitor is used for a Voltage Controlled Oscillator (VCO), and the VCO is used for a Phase Locked Loop (PLL).

20 Claims, 5 Drawing Sheets

(56) References Cited

U.S. PATENT DOCUMENTS

| | | |
|---|---|---|
| 2005/0174184 A1 | 8/2005 | Wu |
| 2007/0222526 A1 | 9/2007 | Mayer et al. |
| 2008/0012654 A1 | 1/2008 | Han et al. |
| 2008/0297267 A1 | 12/2008 | Thaller |
| 2009/0066431 A1 | 3/2009 | Shin et al. |
| 2009/0273402 A1 | 11/2009 | Ruffieux |
| 2009/0295488 A1 | 12/2009 | Zeng et al. |
| 2010/0102894 A1 | 4/2010 | Sun et al. |
| 2010/0271137 A1 | 10/2010 | Kythakyapuzha et al. |
| 2010/0283551 A1 | 11/2010 | Zeng et al. |
| 2011/0148530 A1 | 6/2011 | Geltinger et al. |
| 2011/0267150 A1 | 11/2011 | Fan et al. |

FOREIGN PATENT DOCUMENTS

| | | |
|---|---|---|
| KR | 10-2009-0027014 A | 3/2009 |
| KR | 10-2012-0010378 A | 2/2012 |
| WO | 00/67325 A1 | 11/2000 |

VOLTAGE CONTROLLED OSCILLATOR USING VARIABLE CAPACITOR AND PHASE LOCKED LOOP USING THE SAME

CROSS-REFERENCE TO RELATED APPLICATION(S)

This application is a continuation application of prior application Ser. No. 13/751,449, filed on Jan. 28, 2013, which claimed priority under 35 U.S.C. § 119(a) of a Korean patent application filed on Jan. 30, 2012 in the Korean Intellectual Property Office and assigned Serial No. 10-2012-0008866, the entire disclosure of which is hereby incorporated by reference.

BACKGROUND OF THE INVENTION

1. Field of the Invention

The present invention relates to a Voltage Controlled Oscillator (VCO). More particularly, the present invention relates to a VCO for determining an output frequency by controlling a capacitor value in a cardinal manner.

2. Description of the Related Art

A VCO is a device for outputting a frequency that depends on an externally applied voltage. The VCO is primarily used for an analog sound synthesis apparatus, a mobile communication terminal, and the like. The VCO used for a sound synthesis apparatus generates a sine wave, a sawtooth wave, a pulse wave, a square wave, a triangle wave, and the like to generate a basic sound. The VCO is used for a Phase Locked Loop (PLL) module in a mobile communication terminal to serve as a local oscillator for converting a frequency into a Radio Frequency (RF) or an Intermediate Frequency (IF).

The VCO includes an inductor (L), a capacitor (C), and a negative-gm unit. In an LC-VCO, for realizing negative-gm, an N-type Metal-Oxide-Semiconductor (NMOS) transistor and a P-type Metal-Oxide-Semiconductor (PMOS) transistor are connected in a cross-coupled pair. Because the LC-VCO can obtain a negative-gm that is twice greater than a structure that uses only an NMOS, power consumption may be reduced.

In addition, in an LC-VCO circuit, a resonance frequency has a value inversely proportional to $\sqrt{LC}$. According to the related art, an inductor is fixed as a constant, and an output frequency is controlled by changing a capacitor value. A frequency range is set using a capacitor band having a binary structure and a switch device, and a fine frequency control is performed using a varactor diode, and the like.

According to the related art, a frequency of a VCO in a wireless terminal corresponds to a log scale. The frequency of the VCO is proportional to $1/\sqrt{LC_0}$ depending on a digital code (k) and changes non-linearly in the log scale.

FIG. 1 is a graph illustrating a frequency of a voltage controlled oscillator that depends on a digital code according to the related art.

Referring to FIG. 1, an x axis represents a digital code value determining a capacitor value, and a y axis represents an output frequency of a VCO that depends on a capacitor value which varies according to a digital code value.

FIG. 1 illustrates an example in which when the digital code changes from 1 to 256, a frequency of a VCO changes by 0.1~3 GHz. As illustrated in FIG. 1, as a digital code increases, the frequency of the VOC decreases non-linearly in the log scale.

Assuming that a digital control code is k and a capacitor minimum unit is $C_0$, capacitance of a capacitor bank becomes $kC_0$, and accordingly the frequency of the VCO has a value proportional to $1/\sqrt{kC_0}$. Because capacitance change of a varactor diode is less than 100 fF, a minimum unit $C_0$ should be smaller than 100 fF, and a capacitor band of about 16 bits is required to have a range controlling all of 0.7~3 GHz which are commercial wireless terminal frequencies. However, when a capacitor band becomes 16 bits, a phase noise characteristic is deteriorated very much by parasitic capacitance by a switch device. In addition, accuracy is lowered by a capacitor band change of 216. Therefore, a circuit is designed using two or more VCOs that depend on a frequency range so that the controller is controlled depending on a 7~8-bit control code.

However, because two or more VCOs are used, a circuit area increases at least twofold. Consequently, manufacturing costs increase and power efficiency of the circuit is reduced.

Therefore, a need exists for an apparatus, system and method for providing a VCO circuit that effectively controls a frequency via a capacitor bank whose frequency range linearly corresponds to dB unit given as a log scale.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide a Voltage Controlled Oscillator (VCO) circuit that can effectively control a frequency via a capacitor bank whose frequency range linearly corresponds to dB unit given as a log scale.

In accordance with an aspect of the present invention, a variable capacitor is provided. The variable capacitor includes a plurality of capacitor segments connected in parallel within the variable capacitor, wherein when a plurality of candidate capacitances allowable to the variable capacitor according to a connection state of the plurality of capacitor segments connected in parallel are sorted in a magnitude sequence, the plurality of candidate capacitances form a geometric series.

In accordance with another aspect of the present invention, a VCO is provided. The VCO includes a resonance circuit in which an inductor and a variable capacitor are connected in parallel to oscillate a frequency, and first and second amplifier circuits for amplifying an oscillation frequency output from the resonance circuit, wherein capacitance of the variable capacitor is controlled exponentially according to a digital code.

In accordance with another aspect of the present invention, a Phase Locked Loop (PLL) is provided. The PLL includes a phase comparator for measuring a phase difference between a phase of an input signal and a phase of a signal fed back from a VCO to output a voltage proportional to the phase difference, a low pass filter for removing a high frequency component of a phase difference between two signals output from the phase comparator and for outputting a control voltage for reducing the phase difference, and the VCO for oscillating a frequency according to the control voltage from the low pass filter, wherein the VCO linearly controls the frequency according to a digital code corresponding to the control voltage.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Hereinafter, a Voltage Controlled Oscillator (VCO) for determining an output frequency by controlling a capacitor value in a cardinal manner is described.

Figure 2:
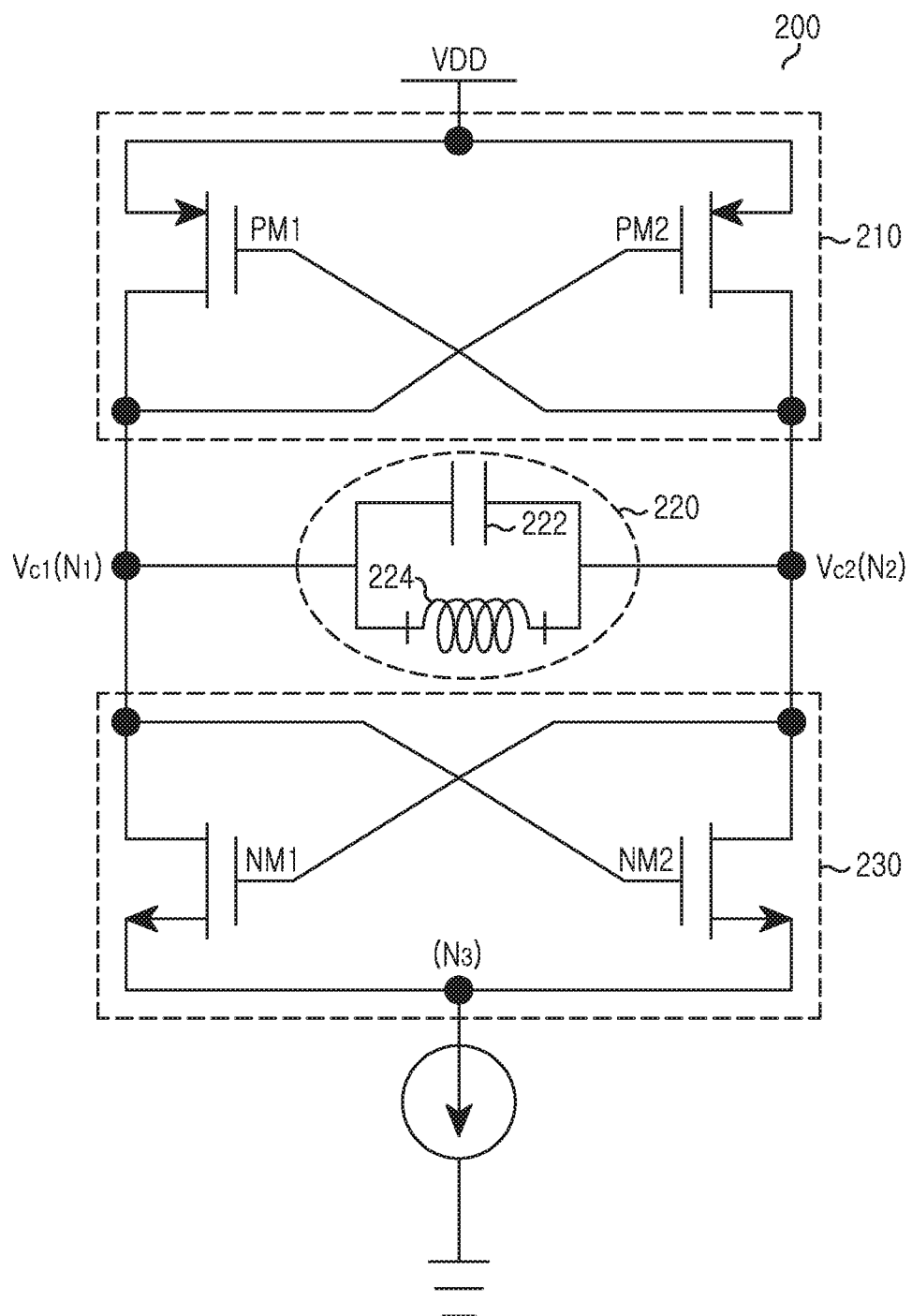
FIG. 2 is a circuit diagram illustrating a Voltage Controlled Oscillator (VCO) for exponentially controlling a capacitor value determining a frequency according to an exemplary embodiment of the present invention.

FIG. 2 is a circuit diagram illustrating a Voltage Controlled Oscillator (VCO) for exponentially controlling a capacitor value determining a frequency according to an exemplary embodiment of the present invention.

Referring to FIG. 2, the VCO 200 includes a resonance circuit 220 for oscillating a frequency that depends on first and second control voltages $V_{C1}$ and $V_{C2}$, and first and second amplifier circuits 210 and 230 for differentially amplifying an oscillation frequency output from the resonance circuit 220.

The first amplifier circuit 210 includes first and second PMOS transistor PM1 and PM2, and the second amplifier circuit 230 includes first and second NMOS transistors NM1 and NM2. The resonance circuit 220 includes a variable capacitor 222 and an inductor 224 connected in parallel.

A connection relation of each element is described below in more detail.

The first PMOS transistor PM1 is connected between a power voltage VOD and a first node N1, and the second PMOS transistor PM2 is connected between the power voltage VDD and a second node N2. Also, the resonance circuit 220 including the variable capacitor 222 and the inductor 224 is connected between the first node N1 and the second node N2.

The first NMOS transistor NM1 is connected between the first node N1 and a third node N3, and the second NMOS transistor NM2 is connected between the second node N2 and the third node N3. Also, a bias current is supplied between the third node N3 and a ground terminal GND.

According to exemplary embodiments of the present invention, the first PMOS transistor PM1 and the second PMOS transistor PM2 are cross-coupled with the second NMOS transistor NM2 and the first NMOS transistor NM1, respectively, which is described below specifically.

A drain terminal of the first NMOS transistor NM1 is connected to a gate terminal of the second PMOS transistor PM2, and a drain terminal of the second NMOS transistor NM2 is connected to a gate terminal of the first PMOS transistor PM1. Also, a drain terminal of the first PMOS transistor PM1 is connected to a gate terminal of the second NMOS transistor NM2, and a drain terminal of the second PMOS transistor PM2 is connected to a gate terminal of the first NMOS transistor NM1.

For example, the first NMOS transistor NM1 and the second NMOS transistor NM2 are cross-coupled with the second PMOS transistor PM2 and the first PMOS transistor PM1, respectively, via the resonance circuit 220.

The voltage controlled oscillator 200 according to exemplary embodiments of the present invention having the above construction generates resonance via the resonance circuit 220 including the inductor 222 and the variable capacitor 224 depending on an input voltage, and outputs a frequency corresponding to the input voltage. A value of the variable capacitor 222 is controlled exponentially, and a resonance frequency is determined depending on a value of the variable capacitor 222.

The exponentially controlled variable capacitor 222 is described below in detail with reference to FIG. 3.

The following exemplary embodiment of the present invention illustrates a case in which capacitance of a unit capacitor changes exponentially up to 420 times depending on a 3-bit digital code. This dynamic range is a range that is realizable when 9 bits are used in the case in which a binary capacitor bank according to the related art is used.

Exemplary embodiments of the present invention include a capacitor bank structure that can exponentially increase a gain with respect to a digital code of N bits equal to or greater than 2 bits. Exemplary embodiments of the present invention are described using an example of an operation with a 3-bit digital control code of b0, b1, and b2.

Figure 3:
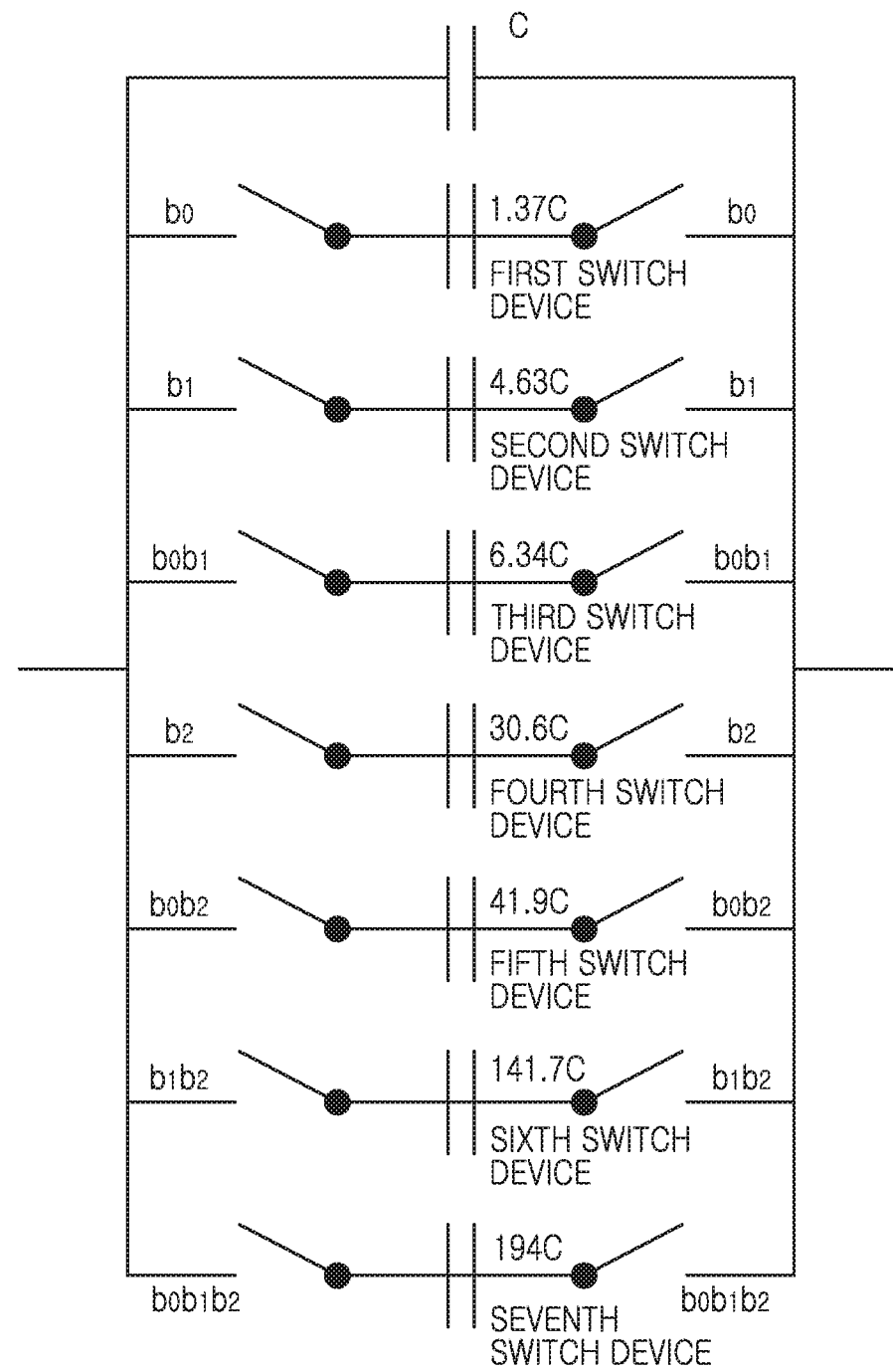
FIG. 3 is a view illustrating a variable capacitor bank exponentially controlled according to an exemplary embodiment of the present invention.

FIG. 3 is a view illustrating a variable capacitor bank exponentially controlled according to an exemplary embodiment of the present invention.

Referring to FIG. 3, the variable capacitor includes a plurality of capacitor segments and a plurality of switch segments determining connection of the plurality of capacitor segments. Switching of a first switch device is connected by a first bit of the 3-bit digital code, switching of a second switch device is connected by a second bit of the 3-bit digital code, and switching of a fourth switch device is connected by a third bit of the 3-bit digital code. Also, switching of a third switch device is connected by a result of an AND operation of the first bit and the second bit of the digital code, switching of a fifth switch device is connected by a result of an AND operation of the first bit and the third bit of the digital code, switching of a sixth switch device is connected by a result of an AND operation of the second bit and the third bit of the digital code, and switching of a seventh switch device is connected by a result of an AND operation of the first bit, the second bit, and the third bit of the digital code.

According to exemplary embodiments of the present invention, with respect to a digital code k, a synthesized capacitance capacity may be generalized by Equation (1).

$$C_{total} = C_0 \cdot 10^{\frac{k}{2^N} Z} \quad (1)$$

where $C_0$ is a unit capacitance for a digital code=0, N is the number of bits representing a digital code, and Z is a compression constant determining capacitance between two digital codes. For example, a compression constant Z determines a difference between capacitance for a first digital code value and capacitance for a second digital code value.

An exemplary embodiment of the present invention sets N=3 and Z=3.

In the case in which a digital code input is 0 (b2b1b0=000), only a basically connected upper unit capacitor is connected, so that a synthesized capacitance becomes C. At this point, all of the first switch device to the seventh switch device are turned off.

In the case in which the digital code is 1 (b2b1b0=001), capacitors are connected via a switch device b0, so that capacitance becomes 2.37C (e.g., synthesized capacitance=C+1.37C). At this point, only the first switch device is turned on and the rest of the switch devices are turned off.

In the case in which the digital code is 2 (b2b1b0=010), a switch device b1 is turned on, so that a synthesized capacitance becomes 5.63C (e.g., synthesized capacitance=C+4.63C). At this point, only the second switch device is turned on and the rest of the switch devices are turned off.

In the case in which the digital code is 3 (b2b1b0=011), both switch devices b0 and b1 are turned on, so that a synthesized capacitance becomes 13.34C (e.g., synthesized capacitance=C+1.37C+4.63C+6.34C). At this point, the first switch device, the second switch device, and the third switch device are turned on, and the fourth switch device to the seventh switch device are turned off. The third switch device is switched by a result of an AND operation of a first bit (b0) and a second bit (b1). For example, the third switch device is turned on only when both b0 and b1 are 1.

In the case in which the digital code is 4 (b2b1b0=100), a switch device b2 is turned on, so that a synthesized capacitance becomes 31.6C (e.g., synthesized capacitance=C+30.6C). At this point, only the fourth switch device is turned on and the rest of the switch devices are turned off.

In the case in which the digital code is 5 (b2b1b0=101), b0 and b2 are turned on, so that a synthesized capacitance becomes 74.87C (e.g., synthesized capacitance=C+1.37C+30.6C+41.9C). At this point, only the first switch device and the fourth switch device are turned on and the rest of the switch devices are turned off.

In the case in which the digital code is 6 (b2b1b0=110), b1 and b2 are turned on, so that a synthesized capacitance becomes 177.93C (e.g., synthesized capacitance=C+4.63C+30.6C+141.7C). At this point, the second switch device, the fourth switch device, and the sixth switch device are turned on, and the rest of the switch devices are turned off. The sixth switch device is switched by a result of an AND operation of the second bit (b1) and the third bit (b2). For example, the sixth switch device is turned on only when both b1 and b3 are 1.

In the case in which the digital code is 7 (b2b1b0=111), all of the switch devices are turned on, so that a synthesized capacitance becomes 421.7C (e.g., synthesized capacitance=C+1.37C+4.63C+6.34C+30.6C+41.9C+141.7C+194C). At this point, all of the first switch device to the seventh switch device are turned on. Here, the seventh switch device is switched by a result of an AND operation of the first bit (b0), the second bit (b1), and the third bit (b2). For example, the seventh switch device is turned on only when all of b0, b1, and b2 are 1.

This may be generalized below. In case in which k=4×b2+2×b1+b0, a synthesized capacitance is expanded using a Taylor series, and when b2N=b2, b1N=b1, and b0N=b0 are input with consideration of a fact that all of b2, b1, and b0 are 1 or 0, Equation (2) is obtained.

$$\begin{aligned}C_{total} &= C \times 10^{kZ/2^N} = C \times 10^{(4 \times b2 + 2 \times b1 + b0)Z/2^N} \quad (2)\\ &= C \times (1 + k \cdot \ln10 \cdot Z/2^N + (k \cdot \ln10 \cdot Z/2^N)2^2/2! + \\ &\quad (k \cdot \ln10 \cdot Z/2^N)/3! + \ldots \\ &= C(1 + 1.37 \times b0 + 4.63 \times b1 + 6.34 \times b0b1) \times (1 + 30.6 \times b2)\end{aligned}$$

As illustrated in Equation (2), when a capacitor bank increases exponentially, a reciprocal of a square root of a capacitor bank capacity also has an exponential characteristic. Therefore, the capacitor bank becomes a structure that increases or decreases exponentially depending on a digital code so that the capacitor bank may be linear to a log scale.

Figure 4:
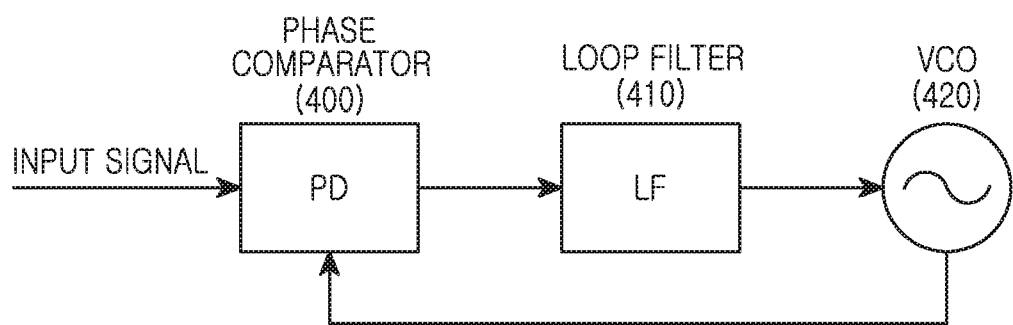
FIG. 4 is a block diagram illustrating a Phase Locked Loop (PLL) module according to an exemplary embodiment of the present invention.

FIG. 4 is a block diagram illustrating a Phase Locked Loop PLL module according to an exemplary embodiment of the present invention.

Referring to FIG. 4, the PLL module includes a phase comparator 400, a loop filter 410, and a Voltage Controlled Oscillator (VCO).

The phase comparator 400 measures a difference between a phase of a received input signal and a phase of a signal fed back from the Voltage Controlled Oscillator (VCO) so as to output a voltage that is proportional to the phase difference to the loop filter 410.

The loop filter 410 is a low pass filter and removes a high frequency component of the phase difference between the two signals output from the phase comparator 400, and provides a control voltage for reducing the phase difference to the VCO.

The VCO generates a frequency that depends on a control voltage from the loop filter 410. For example, a variable capacitor value such as the variable capacitor value generated by the variable capacitor bank of FIG. 3 is removed exponentially depending on a control voltage from the loop filter 410, so that a resonance frequency is determined.

A PLL operation is described. A phase difference detected by the phase comparator 400 changes to a DC voltage via a low pass filter, and is provided to the VCO. The VCO includes the resonance circuit including the inductor and the variable capacitor, so that when a DC voltage corresponding to the phase difference is input, capacitance of the variable capacitor changes to generate an oscillation frequency change by an LC resonance circuit. Therefore, an output frequency fixed at the phase of an input reference frequency is generated.

Figure 5:
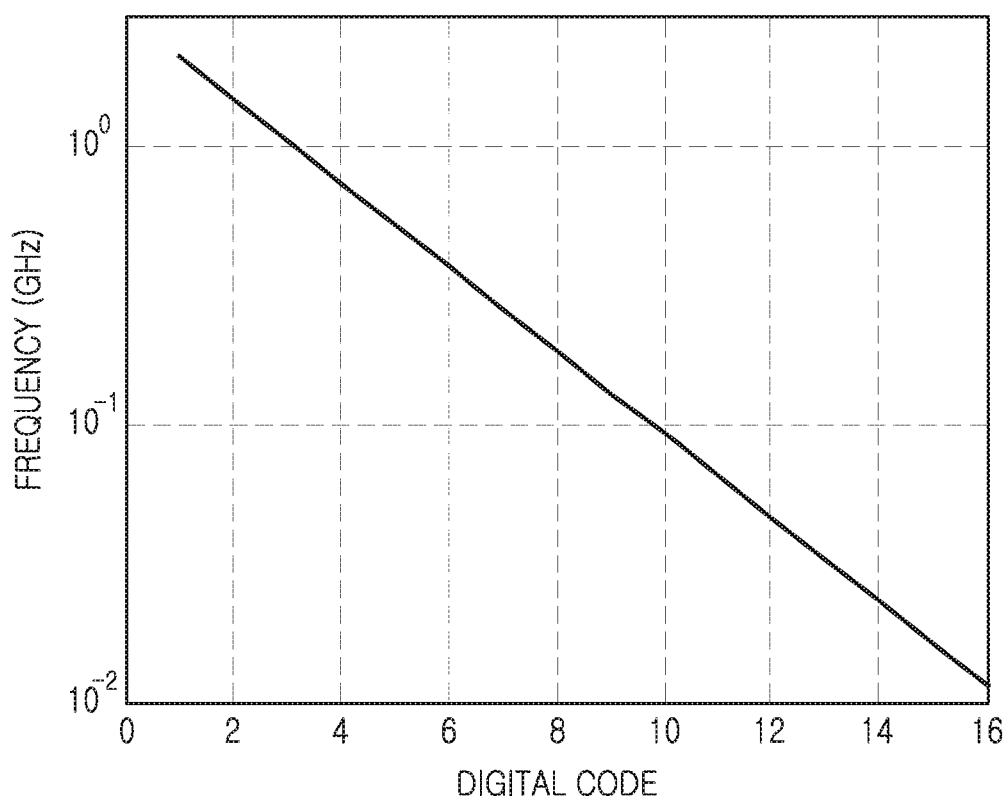
FIG. 5 is a graph illustrating a frequency relation between a digital code and a VCO determining a variable capacitor value according to an exemplary embodiment of the present invention.

FIG. 5 is a graph illustrating a frequency relation between a digital code and a VCO determining a variable capacitor value according to an exemplary embodiment of the present invention.

Figure 1:
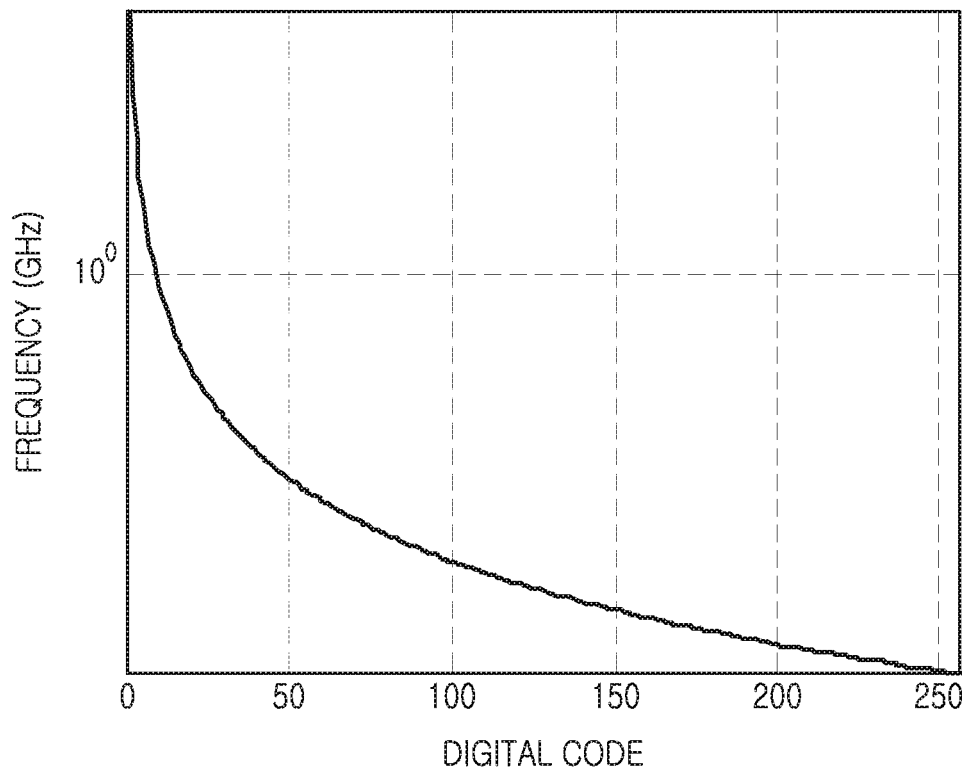
FIG. 1 is a graph illustrating a frequency of a voltage controlled oscillator that depends on a digital code according to the related art.

Referring to FIG. 5, an example of controlling frequencies of 0.01~3 GHz using control codes of digital codes 1 to 16 is illustrated. In FIG. 5, a frequency can be controlled using a 4-bit control code rather than an 8-bit control code of FIG. 1, and a frequency range becomes ten times in terms of a log scale. As described above, a frequency efficiency may be maximized via a capacitor bank control linear to the log scale.

As described above, exemplary embodiments of the present invention have an advantage of increasing a frequency control range without increasing the number of control code bits by controlling a frequency control of the VCO exponentially depending on a digital code. For example, the frequency control of the VCO is controlled such that the frequency varies linearly with respect to a log scale.

Also, exemplary embodiments of the present invention have an advantage of not only reducing manufacturing costs by efficiently controlling digital information to reduce a circuit area, but also raising a Quality factor of the VCO by reducing a side effect by parasitic capacitance and parasitic resistance of a switch device with respect to a wide operation range.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A variable capacitor comprising:
   a capacitor bank comprising a plurality of capacitor segments; and
   a plurality of switch segments configured to control connection states of each of the plurality of capacitor segments,
   wherein the capacitor bank provides a capacitance from a set of candidate capacitances based on the connection states,
   wherein the connection states are controlled based on a control code,
   wherein the capacitance provided by the capacitor bank is linearly changed on a log scale by linearly increasing a value of the control code,
   wherein the candidate capacitances form a geometric series with a constant ratio between successive candidate capacitances, and
   wherein the constant ratio is related to a quantity of the switch segments in the capacitor bank.

2. The variable capacitor of claim 1,
   wherein each capacitor segment of the plurality of capacitor segments has a different capacitance, and
   wherein the set of candidate capacitances provided by all possible combinations of the plurality of capacitor segments have a non-linear distribution.

3. The variable capacitor of claim 1,
   wherein the control code comprises a plurality of bits,
   wherein each of the switch segments is on or off according to a control signal that corresponds to a value of one bit of the control code or a value determined by combining at least two bits of the control code,
   wherein each of all values of individual bits of the control code is used to control at least one of the switch segments, and
   wherein each of all values derived from combinations of at least two bits of the control bits is used to control at least one of the switch segments.

4. The variable capacitor of claim 1,
   wherein a portion of the plurality of the switch segments is directly controlled based on the control code, and
   wherein a remaining portion of the plurality of the switch segments is controlled based on at least one logic operation between at least two bits of the control code.

5. The variable capacitor of claim 1, wherein the capacitor bank comprises a first capacitor segment that is connected regardless of the plurality of the switch segments.

6. The variable capacitor of claim 1, wherein one of the set of candidate capacitances is provided by a combination of all of the plurality of capacitor segments.

7. The variable capacitor of claim 1, wherein the set of candidate capacitances is exponentially distributed without a binary-weighted capacitor array.

8. The variable capacitor of claim 1,
   wherein the control code is converted into control signals that control the plurality of switch segments, and
   wherein a total number of the control signals is equal to a total number of all possible combinations of bits of the control code.

9. A voltage controlled oscillator (VCO) comprising:
   a resonance circuit configured to generate a signal with a frequency; and
   an amplifier circuit configured to amplify the signal,
   wherein the resonance circuit comprises an inductor and a variable capacitor that are coupled in parallel,
   wherein the variable capacitor comprises a capacitor bank comprising a plurality of capacitor segments, and a plurality of switch segments configured to control connection states of each of the plurality of capacitor segments,
   wherein the capacitor bank provides a capacitance from a set of candidate capacitances based on connection states of the plurality of capacitor segments,
   wherein the connection states are controlled based on a control code,
   wherein the capacitance provided by the capacitor bank is linearly changed on a log scale by linearly increasing a value of the control code, and
   wherein the frequency of the signal is linearly changed on the log scale by linearly increasing the value of the control code.

10. The VCO of claim 9,
wherein each capacitor segment of the plurality of capacitor segments has a different capacitance, and
wherein the set of candidate capacitances provided by all possible combinations of the plurality of capacitor segments has a non-linear distribution.

11. The VCO of claim 9,
wherein the control code comprises a plurality of bits,
wherein each of the switch segments is on or off according to a control signal that corresponds to a value of one bit of the control code or a value determined by combining at least two bits of the control code,
wherein each of all values of individual bits of the control code is used to control at least one of the switch segments, and
wherein each of all values derived from combinations of at least two bits of the control bits is used to control at least one of the switch segments.

12. The VCO of claim 9,
wherein a portion of the plurality of the switch segments is directly controlled based on the control code, and
wherein a remaining portion of the plurality of the switch segments is controlled based on at least one logic operation between at least two bits of the control code.

13. The VCO of claim 9, wherein the set of candidate capacitances are exponentially distributed without a binary-weighted capacitor array.

14. The VCO of claim 9,
wherein the control code is converted into control signals that control the plurality of switch segments, and
wherein a total number of the control signals is equal to a total number of all possible combinations of bits of the control code.

15. A phase locked loop (PLL) comprising:
a phase comparator configured to:
measure a phase difference between a phase of an input signal and a phase of a signal fed back from a voltage controlled oscillator (VCO), and
output a voltage signal proportional to the phase difference; and
a low pass filter configured to:
remove a high frequency component of the voltage signal, and
output a control voltage,
wherein the VCO is configured to generate an output signal with a frequency according to a control code corresponding to the control voltage,
wherein the VCO comprises a variable capacitor configured to provide a capacitance from a set of candidate capacitances,
wherein the variable capacitor comprises:
a capacitor bank comprising a plurality of capacitor segments; and
a plurality of switch segments configured to control connection states of each of the plurality of capacitor segments,
wherein the capacitor bank provides the capacitance based on connection states of the plurality of capacitor segments,
wherein the connection states are controlled based on the control code,
wherein the capacitance provided by the capacitor bank is linearly changed on a log scale by linearly increasing a value of the control code, and
wherein the frequency of the output signal is linearly changed on the log scale by linearly increasing the value of the control code.

16. The PLL of claim 15,
wherein each capacitor segment of the plurality of capacitor segments has a different capacitance, and
wherein the set of the candidate capacitances provided by all possible combinations of the plurality of capacitor segments has a non-linear distribution.

17. The PLL of claim 15,
wherein the control code comprises a plurality of bits,
wherein each of the switch segments is on or off according to a control signal that corresponds to a value of one bit of the control code or a value determined by combining at least two bits of the control code,
wherein each of all values of individual bits of the control code is used to control at least one of the switch segments, and
wherein each of all values derived from combinations of at least two bits of the control bits is used to control at least one of the switch segments.

18. The PLL of claim 15,
wherein a portion of the plurality of the switch segments is directly controlled based on the control code, and
wherein a remaining portion of the plurality of the switch segments is controlled based on at least one logic operation between at least two bits of the control code.

19. The PLL of claim 15, wherein the set of candidate capacitances is exponentially distributed without a binary-weighted capacitor array.

20. The PLL of claim 15,
wherein the control code is converted into control signals that control the plurality of switch segments, and
wherein a total number of the control signals is equal to a total number of all possible combinations of bits of the control code.

* * * * *